United States Patent
Kim

(10) Patent No.: US 11,656,265 B2
(45) Date of Patent: May 23, 2023

(54) APPARATUS FOR MEASURING INSULATION RESISTANCE

(71) Applicant: SK On Co., Ltd, Seoul (KR)

(72) Inventor: Woo Jung Kim, Daejeon (KR)

(73) Assignee: SK On Co., Ltd., Seoul (KR)

( * ) Notice: Subject to any disclaimer, the term of this patent is extended or adjusted under 35 U.S.C. 154(b) by 0 days.

(21) Appl. No.: 17/226,470

(22) Filed: Apr. 9, 2021

(65) Prior Publication Data

US 2021/0318372 A1 Oct. 14, 2021

(30) Foreign Application Priority Data

Apr. 13, 2020 (KR) .................... 10-2020-0044425

(51) Int. Cl.
*G01R 31/12* (2020.01)
*G01R 31/3842* (2019.01)
*G01R 27/08* (2006.01)

(52) U.S. Cl.
CPC ............. *G01R 31/12* (2013.01); *G01R 27/08* (2013.01); *G01R 31/3842* (2019.01)

(58) Field of Classification Search
CPC .... G01R 31/12; G01R 31/3842; G01R 31/52; G01R 27/08; G01R 27/025; G01R 1/203; G01R 1/206; B60L 3/0046
See application file for complete search history.

(56) References Cited

U.S. PATENT DOCUMENTS

| | | | |
|---|---|---|---|
| 9,024,646 B2 | 5/2015 | Huh | |
| 10,534,032 B2 | 1/2020 | Sung et al. | |
| 2013/0176041 A1* | 7/2013 | Yang | G01R 27/14 |
| | | | 324/691 |
| 2013/0176042 A1* | 7/2013 | Huh | G01N 27/04 |
| | | | 324/693 |
| 2014/0247858 A1* | 9/2014 | Hong | H01M 10/486 |
| | | | 374/142 |
| 2017/0016951 A1 | 1/2017 | Sung et al. | |
| 2019/0011504 A1 | 1/2019 | Kim et al. | |
| 2019/0064279 A1* | 2/2019 | Dan | G01R 31/3662 |
| 2020/0088803 A1 | 3/2020 | Park et al. | |

(Continued)

FOREIGN PATENT DOCUMENTS

| KR | 101610921 B1 | 4/2016 |
|---|---|---|
| KR | 101856068 B1 | 5/2018 |
| KR | 101908637 B1 | 10/2018 |

(Continued)

*Primary Examiner* — Tarun Sinha
*Assistant Examiner* — Lal C Mang
(74) *Attorney, Agent, or Firm* — The Webb Law Firm

(57) ABSTRACT

The present invention relates to an apparatus capable of measuring an insulation resistance of a battery, and according to the apparatus capable of measuring the insulation resistance of the present invention. A voltage measurement unit may measure a voltage with respect to a potential of a negative terminal of a battery rather than the ground, and thus parameters requiring a high precision may be measured using one device, thereby reducing cost, and, because a first sensing substrate and a second sensing substrate are separated, different potentials may be used as the ground, thereby securing a better insulation performance between the first sensing substrate that is an HV side and the second sensing substrate that is an LV side.

9 Claims, 6 Drawing Sheets

(56) References Cited

U.S. PATENT DOCUMENTS

2020/0144812 A1* 5/2020 Shin ..................... H02H 7/18

FOREIGN PATENT DOCUMENTS

| KR | 101936220 B1 | 1/2019 |
| KR | 20190001330 A | 1/2019 |
| KR | 101991910 B1 | 6/2019 |
| KR | 20190072272 A | 6/2019 |
| KR | 101984326 B1 | 9/2019 |

* cited by examiner

APPARATUS FOR MEASURING INSULATION RESISTANCE

CROSS-REFERENCE TO RELATED APPLICATION

This application claims priority to Korean Patent Application No. 10-2020-0044425 filed Apr. 13, 2020, the disclosure of which is hereby incorporated by reference in its entirety.

BACKGROUND OF THE INVENTION

Field of the Invention

The present invention relates to an apparatus capable of measuring an insulation resistance of a battery.

Description of Related Art

Recently, an electric vehicle (EV) using an electric battery capable of charging and discharging as a power source has been commercialized as an eco-friendly vehicle. The electric vehicle includes a battery pack used as a power source that provides a high voltage (HV) to a driving electric motor, an inverter, a converter, and the like that require the high voltage for the operation of vehicle, and a lead acid battery used as a power source providing a low voltage (LV) to electronics of vehicle.

At this time, the insulation resistance of the battery pack may decrease or the insulation thereof may be destroyed due to a deterioration. In this case, it is very dangerous because a person touching a chassis may be electrocuted by the high voltage of the battery pack, and thus it needs to continuously measure and monitor the insulation resistance of the battery pack so that the insulation resistance is not reduced less than a certain level.

Meanwhile, an insulation resistance measurement circuit of the related art has been measured with respect to a low voltage (LV) side ground (for example, a negative terminal of a lead acid battery, a chassis).

RELATED ART DOCUMENT

Patent Document

KR 2010-16109211B1

SUMMARY OF THE INVENTION

Technical Problem

An object of the present invention is to provide an apparatus for measuring an insulation resistance capable of reducing cost by minimizing the number of measuring devices requiring a high precision.

Another object of the present invention is to provide an apparatus for measuring an insulation resistance capable of better securing an insulation performance between a high voltage (HV) side of a sensing substrate and a low voltage (LV) side of the sensing substrate.

Technical Solution

In one general aspect, an apparatus for measuring an insulation resistance of a battery includes: a resistance unit including a voltage measurement resistor configured to divide and measure a voltage of the battery; a switching unit coupled to the resistance unit and including a first switch for forming a different electrical path; and a control unit measuring a voltage applied to the voltage measurement resistor and monitoring the insulation resistance of the battery, and the control unit may measure the voltage applied to the voltage measurement resistor based on a potential of a negative terminal of the battery.

The control unit further comprising a voltage measurement unit configured to measure the voltage applied to the voltage measurement resistor, the voltage measurement resistor may be coupled to the negative terminal of the battery, and the voltage measurement unit may be coupled to the voltage measurement resistance and the negative terminal of the battery.

The apparatus may further include: a first sensing substrate coupled to the battery; and a second sensing substrate coupled to a lead-acid battery having a lower voltage than the battery, and isolated from the first sensing substrate, and the resistance unit and the switching unit may be mounted on the first sensing substrate, and the control unit may be mounted on the second sensing substrate.

The apparatus may further include: a first sensing substrate coupled to the battery; and a second sensing substrate coupled to a lead-acid battery having a lower voltage than the battery, and isolated from the first sensing substrate, and the resistance unit, the switching unit, the voltage measurement unit and the control unit may be mounted on the first sensing substrate.

The resistance unit may further include: a first resistor coupled to a positive terminal of the battery, and a second resistor coupled between the first resistance and the voltage measurement resistor, and the first switch may be coupled between the first resistor and a ground, and the second switch may be coupled between the second resistor and the ground.

The control unit may receive the voltage applied to the voltage measurement resistor while operating the first switch in an off state and the second switch in an on state, and receive the the voltage applied to the voltage measurement resistor while operating both the first switch and the second switch in the on state.

The control unit may calculate a positive insulation resistance and a negative insulation resistance by combining Equation 1 and Equation 2 below.

$$V_{Rmes\_SW2} = \text{Pack } V \times \frac{R_{Leak-}||(R_{mes} + R_2)}{R_{Leak+} + R_{Leak-}||(R_{mes} + R_2)} \times \frac{R_{mes}}{(R_{mes} + R_2)} \quad \text{[Equation 1]}$$

$$V_{Rmes\_SW1\_SW2} = \text{Pack } V \times \frac{R_{Leak-}||(R_{mes} + R_2)}{(R_1||R_{Leak+}) + R_{Leak-}||(R_{mes} + R_2)} \times \frac{R_{mes}}{(R_{mes} + R_2)} \quad \text{[Equation 2]}$$

(where $V_{Rmes\_SW2}$ denotes a voltage applied to the voltage measurement resistor when the first switch operates in the off state and the second switch operates in the on state, $V_{Rmes\_SW1\_SW2}$ denotes a voltage applied to the voltage measurement resistor when both the first switch and the second switch operate in the on state, Pack V denotes a voltage of the battery, $R_{mes}$ denotes a value of the voltage measurement resistor, $R_1$ denotes a value of the first resistor, $R_2$ denotes a value of the second resistor, $R_{Leak}+$ denotes a value of the positive insulation resistance, and $R_{Leak}-$ denotes a value of the negative insulation resistance)

The resistance unit may further include a third resistor coupled between the switching unit and the ground.

The control unit may receive the voltage applied to the voltage measurement resistor while operating the first switch in an off state and the second switch in an on state, and receive the voltage applied to the voltage measurement resistor while operating both the first switch and the second switch in the on state.

The control unit may calculate a positive insulation resistance and a negative insulation resistance by combining Equation 3 and Equation 4 below.

$$V_{Rmes\_SW2} = \text{Pack } V \times \frac{R_{Leak-}||(R_{mes}+R_2+R_3)}{R_{Leak+}+R_{Leak-}||(R_{mes}+R_2+R_3)} \times \frac{R_{mes}}{(R_{mes}+R_2+R_3)} \quad \text{[Equation 3]}$$

$$V_{Rmes\_SW1\_SW2} = \text{Pack } V \times \frac{1}{R_c} - \frac{(R_a||(R_{Leak-})}{(R_b||R_{Leak+})+(R_a||R_{Leak-})} \times \frac{1}{R_a} \times R_{mes} \quad \text{[Equation 4]}$$

(where Equation 4 satisfies $$R_a = \frac{(R_1 \times R_3)+(R_1 \times (R_2+R_{mes}))+(R_3 \times (R_2+R_{mes}))}{R_1}$$

$$R_b = \frac{(R_1 \times R_3)+(R_1 \times (R_2+R_{mes}))+(R_3 \times (R_2+R_{mes}))}{(R_2+R_{mes})}$$

$$R_c = \frac{(R_1 \times R_3)+(R_1 \times (R_2+R_{mes}))+(R_3 \times (R_2+R_{mes}))}{R_3}$$

$V_{Rmes\_SW2}$ denotes a voltage applied to the voltage measurement resistor when the first switch operates in the off state and the second switch operates in the on state, $V_{Rmes\_SW1\_SW2}$ denotes a voltage applied to the voltage measurement resistor when both the first switch and the second switch operate in the on state, Pack V denotes a voltage of the battery, $R_{mes}$ denotes a value of the voltage measurement resistor, $R_1$ denotes a value of the first resistor, $R_2$ denotes a value of the second resistor, $R_3$ is a value of a third resistor, $R_{Leak}+$ denotes a value of the positive insulation resistance, and $R_{Leak}-$ denotes a value of the negative insulation resistance.)

Advantageous Effects

According to an apparatus for measuring an insulation resistance of the present invention, a voltage measurement unit may measure a voltage with respect to a potential of a negative terminal of a battery rather than the ground, and thus parameters requiring a high precision may be measured using one device, thereby reducing cost.

In addition, according to the apparatus for measuring the insulation resistance of the present invention, because a first sensing substrate and a second sensing substrate are separated, different potentials may be used as the ground, thereby securing a better insulation performance between the first sensing substrate that is a HV side and the second sensing substrate that is an LV side.

DESCRIPTION OF THE INVENTION

Hereinafter, the present invention will be described in detail with reference to the accompanying drawings. Detailed descriptions of known functions and configurations that may unnecessarily obscure the subject matter of the present invention will be omitted. In addition, the terms such as ' . . . unit' and 'module' mean a unit that processes at least one function or operation, which may be implemented by hardware or software, or a combination of hardware and software.

Figure 1:
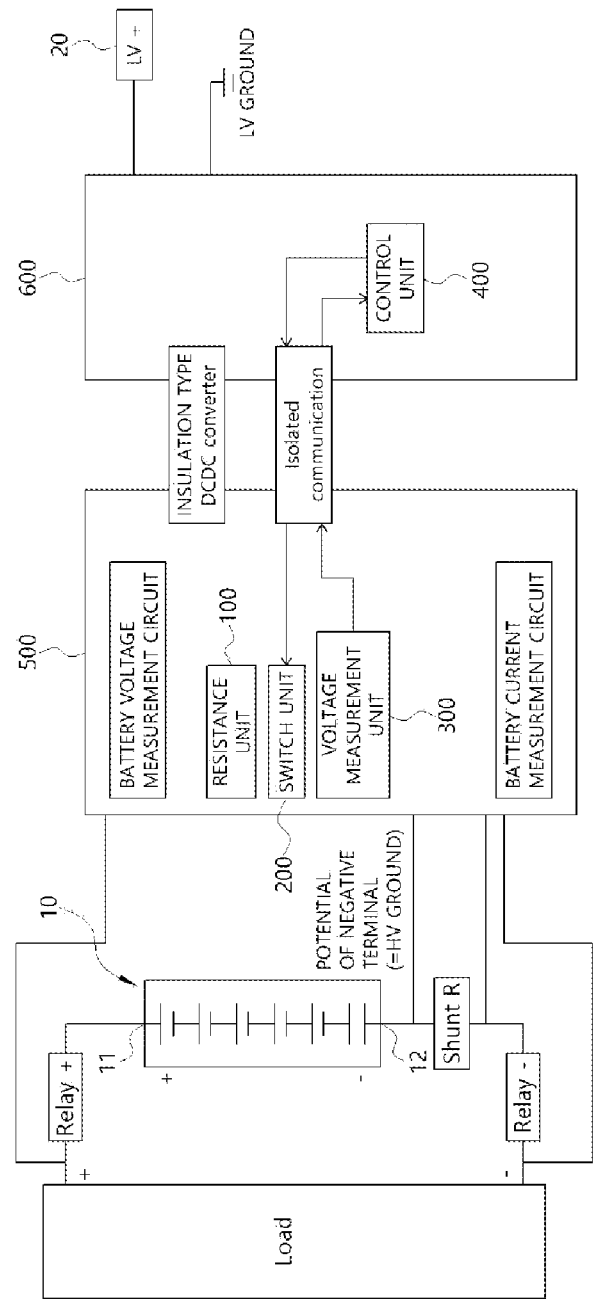
FIG. 1 is a block diagram schematically showing an apparatus for measuring an insulation resistance of the present invention.
Figure 2:
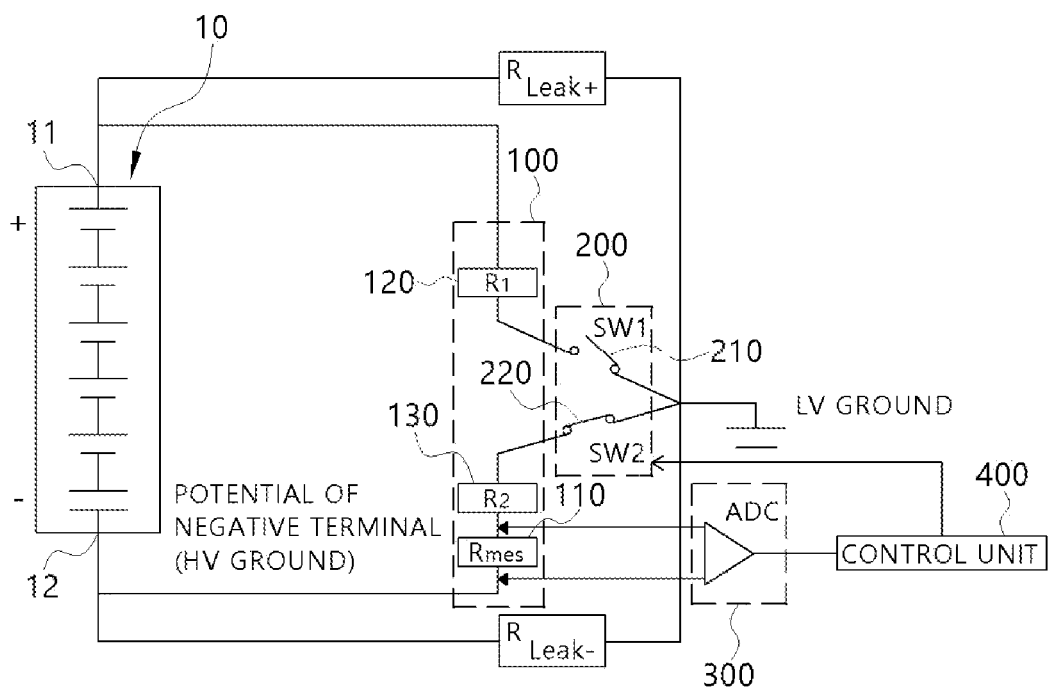
FIG. 2 is a circuit diagram of a first circuit formed in the apparatus for measuring the insulation resistance of the present invention.
Figure 3:
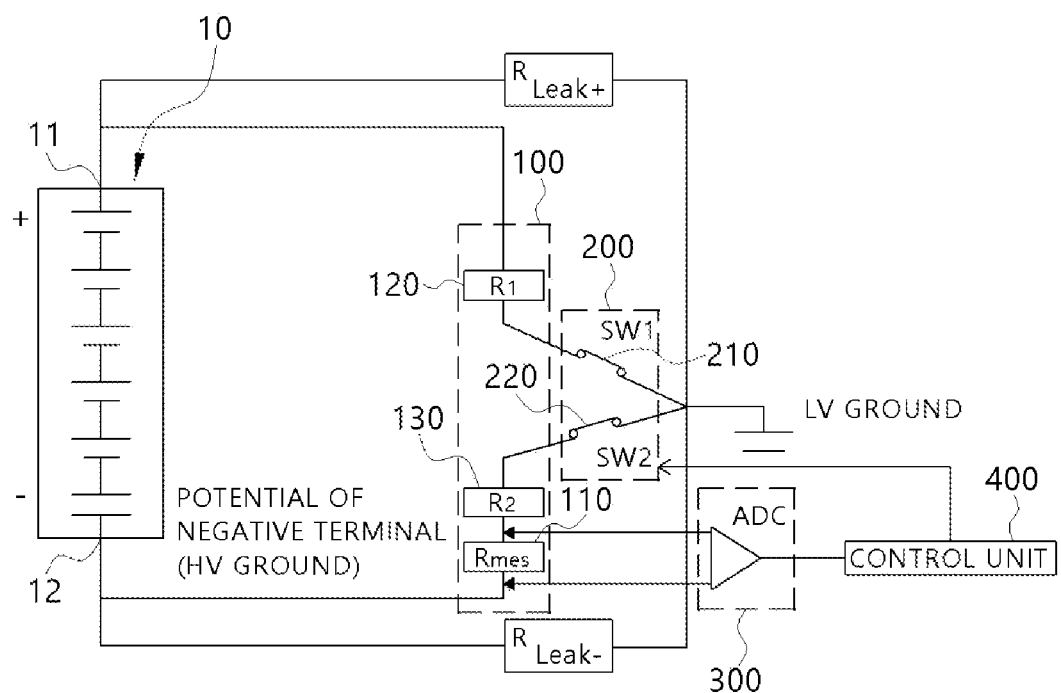
FIG. 3 is a circuit diagram of a second circuit formed in the apparatus for measuring the insulation resistance of the present invention.
Figure 4:
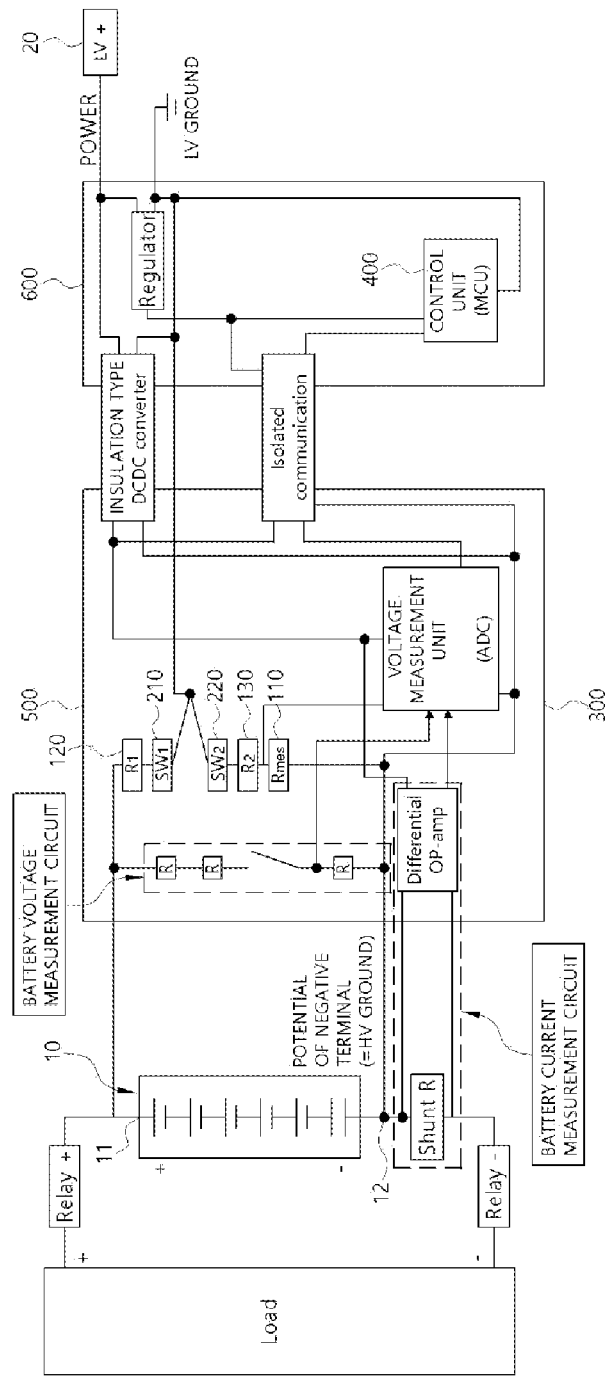
FIG. 4 is a view showing in more detail a connection structure of the apparatus for measuring the insulation resistance of the present invention.

FIG. 1 is a block diagram schematically showing an apparatus for measuring an insulation resistance of the present invention, FIGS. 2 and 3 are circuit diagrams of a first circuit and a second circuit formed in the apparatus for measuring the insulation resistance of the present invention, respectively, and FIG. 4 is a view showing in more detail a connection structure of the apparatus for measuring the insulation resistance of the present invention.

Referring to FIGS. 1 to 3, the apparatus for measuring the insulation resistance of the present invention includes a resistance unit 100, a switching unit 200, a voltage measurement unit 300, and a control unit 400. Here, the control unit 400 may include the voltage measurement unit 300.

The resistance unit 100 may include a plurality of resistors to distribute a voltage of a battery 10. At this time, the plurality of resistors include a voltage measurement resistor 110, a first resistor 120 and a second resistor 130, the first resistor 120 is connected(coupled) to a positive terminal 11 of the battery 10, and the second resistor 130 is connected between the first resistor 120 and the voltage measurement resistor 110. Here, the battery 10 may be formed by connecting a plurality of battery cells in series or in parallel.

The switching unit 200 is connected to the resistance unit 100 and includes a first switch 210 and a second switch 220, and may form circuits having different paths according to on-off operations of the first switch 210 and the second switch 220. That is, the switching unit 200 coupled to the resistance unit 100 and including the first switch 210 and the second switch 220 for forming a different electrical path.

Next, the voltage measurement unit 300 is a configuration that measures an voltage applied to the voltage measurement resistor 110, and may include an analog-to-digital converter (ADC) that receives an analog voltage signal and converts the analog voltage signal into digital data. In this case, an operation power of the voltage measurement unit 300 may be supplied from a pack of the battery 10 or may be supplied from a lead acid battery 20 through an insulation type DC-DC converter.

Meanwhile, in the apparatus for measuring the insulation resistance of the present invention, the voltage measurement unit 300 measures an voltage applied to the voltage measurement resistor 110 with respect to a potential of a negative terminal 12 of the battery 10.

Next, the control unit 400 measuring a voltage applied to the voltage measurement resistor 110 and monitoring the insulation resistance of the battery. The control unit 400 is a configuration that controls the switching unit 200 and simultaneously receives the voltage applied to the voltage measurement resistor 110 measured by the voltage measurement unit 300 to calculate a positive insulation resistance and a negative insulation resistance.

More specifically, the control unit 400 may receive the voltage applied to the voltage measurement resistor 110 measured by the voltage measurement unit 300 while the first switch 210 operates in an off state and the second switch 220 operates in an on state, and may receive the voltage applied to the voltage measurement resistor 110 measured by the voltage measurement unit 300 while both the first switch 210 and the second switch 220 operate in an on state. Here, the control unit 400 may be a microcontrol unit (MCU).

In this regard, the positive insulation resistance means a resistance between the positive terminal 11 of the battery 10 and the ground, and the negative insulation resistance means a resistance between the negative terminal 12 of the battery 10 and the ground. The ground is a low voltage (LV) ground, and is generally a chassis of a vehicle.

Hereinafter, a specific connection structure of the apparatus for measuring the insulation resistance of the present invention will be described.

Referring to FIGS. 2 and 3, one end of the first resistor 120 is connected to the positive terminal 11 of the battery 10 and the other end is connected to one end of the first switch 210. One end of the second resistor 130 is connected to the voltage measurement resistor 110 and the other end is connected to one end of the second switch 220. The other ends of the first switch 210 and the second switch 220 are connected to the ground.

At this time, the voltage measurement resistor 110 has one end connected to the negative terminal 12 of the battery 10 and the other end connected to the second resistor 130. In addition, the voltage measurement unit 300 is connected to each of the negative terminal 12 of the battery 10 and the voltage measurement resistor 110, thereby measuring the voltage applied to the voltage measurement resistor 110 with respect to the potential of the negative terminal 12 of the battery 10.

Meanwhile, a voltage and current of a battery, and an inverter voltage (hereinafter referred to as high voltage (HV) measurement parameters), etc. are measured with respect to a potential of a negative terminal of the battery. The HV measurement parameters are parameters for diagnosing the battery and are related to a safe operation of the vehicle, and thus need to be measured with a high precision, which is the same as a measurement of the insulation resistance.

However, as described above, the insulation resistance measurement circuit of the related art is measured with respect to the ground. To explain this more specifically, one end of a voltage measurement resistor is connected to the ground, and accordingly, a voltage measurement unit is configured to measure a voltage applied to the voltage measurement resistor with respect to a ground potential.

Therefore, in the related art, because HV measurement parameters and insulation resistance are measured using different potentials as a reference point, a device for measuring the insulation resistance needs to use a different device independent from the measurement device of the above-described HV measurement parameters.

In the present invention, the voltage measurement unit 300 is connected to the negative terminal 12 of the battery 10, other than the ground, so that the potential of the negative terminal 12 of the battery 10 is used as a reference potential when measuring the voltage applied to the voltage measurement resistor 110. Accordingly, the voltage measurement unit 300 may be configured by adding a voltage measurement function to a device (e.g., an ADC) used when measuring HV measurement parameters. That is, by implementing the measurement of parameters related to a safe driving of an electric vehicle with one device, the number of devices that require a measurement of a high precision may be reduced. Meanwhile, because the high precision is a factor that increases the cost, a cost reduction effect increases as the number of devices that require the high precision decreases.

As a result, by connecting the voltage measurement unit 300 to the negative terminal 12 of the battery 10 other than the ground, there is an effect of reducing the manufacturing cost in configuring a battery system.

Referring to FIG. 4, this may be more easily understood. As a reference input of the voltage measurement unit 300 of the apparatus of measuring the insulation resistance of the present invention, the potential of the negative terminal 12 of the battery 10 is connected. Therefore, a voltage measurement circuit of the battery 10, a current measurement circuit of the battery 10, and the voltage measurement resistor 110 of the apparatus of measuring the insulation resistance may all be connected to one voltage measurement unit 300, and thus other measurement unit except for the measurement device included in the voltage measurement unit 300 does not need to have a high precision.

Hereinafter, a method of measuring the insulation resistance using the apparatus of measuring the insulation resistance of the present invention will be described in detail.

First, the control unit 400 may form a first circuit by operating the first switch 210 in the off state and the second switch 220 in the on state as shown in FIG. 2. Here, operating a switch in the on state means that the switch is electrically conducted, and operating a switch in the off state means that the switch is not electrically conducted but is cut off.

The first circuit includes a closed circuit connecting the battery 10, the positive insulation resistance, the second resistor 130, and the voltage measurement resistor 110, and a closed circuit connecting the second resistor 130, the voltage measurement resistor 110, and the negative insulation resistance.

While the first circuit is formed, the voltage measurement unit 300 measures the voltage applied to the voltage measurement resistor 110 and transmits the voltage to the control unit 400. Meanwhile, when applying a voltage distribution principle to the first circuit, the following Equation 1 is calculated.

$$V_{Rmes\_SW2} = \text{Pack } V \times \frac{R_{Leak-} \| (R_{mes} + R_2)}{R_{Leak+} + R_{Leak-} \| (R_{mes} + R_2)} \times \frac{R_{mes}}{(R_{mes} + R_2)} \qquad \text{[Equation 1]}$$

Here, $V_{Rmes\_SW2}$ denotes a voltage applied to a voltage measurement resistor $R_{mes}$ when the first switch 210 operates in the off state and the second switch 220 operates in the on state, Pack V denotes a voltage of the battery 10, $R_{mes}$ denotes a value of the voltage measurement resistor 110, $R_1$ denotes a value of the first resistor 120, $R_2$ denotes a value of the second resistor 130, $R_{Leak}+$ denotes a value of the positive insulation resistance, and $R_{Leak}-$ denotes a value of the negative insulation resistance.

Next, as shown in FIG. 3, the control unit 400 may form a second circuit by operating both the first switch 210 and the second switch 220 in the on state.

The second circuit includes a closed circuit connecting the battery 10, the first resistor 120, the second resistor 130, and the voltage measurement resistor 110, a closed circuit connecting the positive insulation resistance and the first resistor 120, and a closed circuit connecting the second resistor 130, the voltage measurement resistor 110, and the negative insulation resistance.

While the second circuit is formed, the voltage measurement unit 300 measures the voltage applied to the voltage measurement resistor 110 and transmits the voltage to the control unit 400. Meanwhile, when applying the voltage distribution principle to the second circuit, the following Equation 2 is calculated.

$$V_{Rmes\_SW1\_SW2} = \text{Pack } V \times \frac{R_{Leak-} \| (R_{mes} + R_2)}{(R_1 \| R_{Leak+}) + R_{Leak-} \| (R_{mes} + R_2)} \times \frac{R_{mes}}{(R_{mes} + R_2)} \quad \text{[Equation 2]}$$

Here, $V_{Rmes\_SW1\_SW2}$ denotes a voltage applied to the voltage measurement resistor $R_{mes}$ when both the first switch 210 and the second switch 220 operate in the on state, Pack V denotes the voltage of the battery 10, $R_{mes}$ denotes the value of the voltage measurement resistor 110, $R_1$ denotes the value of the first resistor 120, $R_2$ denotes the value of the second resistor 130, $R_{Leak}+$ denotes the value of the positive insulation resistance, and $R_{Leak}-$ denotes the value of the negative insulation resistance.

In this regard, in Equations 1 and 2, $\|$ denotes a symbol indicating a parallel connection of resistances. In addition, $V_{Rmes\_SW2}$ and $V_{Rmes\_SW1\_SW2}$ are values measured by the voltage measurement unit 300, and the value $R_{mes}$ of the voltage measurement resistor 110, the value $R_1$ the first resistor 120 and the value $R_2$ of the second resistor 130 are known resistance values and may be stored in the control unit 400. Accordingly, because there are two unknowns $R_{Leak}+$ and $R_{Leak}-$, and Equations 1 and 2 including the unknowns are calculated, the positive insulation resistance and the negative insulation resistance may be calculated by a simultaneous equation.

That is, the control unit 400 may calculate the value $R_{Leak}+$ of the positive insulation resistance and the value $R_{Leak}-$ of the negative insulation resistance by combining Equation 1 and Equation 2 calculated from the first circuit and the second circuit.

In addition, the control unit 400 may determine whether the battery 10 has an insulation breakdown based on the value $R_{Leak}+$ of the positive insulation resistance and the value $R_{Leak}-$ of the negative insulation resistance calculated as described above. In this regard, the control unit 400 may store a threshold value of the insulation resistance which is a reference for determining whether the battery 10 has the insulation breakdown. In addition, the control unit 400 may generate a warning signal or generate a signal to cut off power to a main relay of the battery 10 as a follow-up measure when it is determined that the battery 10 has the insulation breakdown.

Meanwhile, the apparatus for measuring the insulation resistance of the present invention may further include a first sensing substrate 500 and a second sensing substrate 600.

Here, the first sensing substrate 500 is a substrate connected to the battery 10 having a high voltage to sense the voltage and current of the battery 10, and the second sensing substrate 600 is a substrate provided with an MCU and communication components and connected to the lead acid battery 20 having a relatively low voltage compared to the battery 10. The sensing substrate may be a printed circuit board (PCB).

In the apparatus for measuring the insulation resistance of the present invention, the first sensing substrate 500 may be a substrate separated (isolated) from the second sensing substrate 600. Here, separating means not only that the first sensing substrate 500 and the second sensing substrate 600 are insulated through an insulating device (for example, a DC-DC converter including a transformer, an isolated(insulated) communication line, etc.) but also that the first sensing substrate 500 and the second sensing substrate 600 are spatially separated different substrates.

At this time, as shown in FIG. 1, the resistance unit 100, the switching unit 200, and the voltage measurement unit 300 may be mounted on the first sensing substrate 500, and the control unit 400 may be mounted on the second sensing substrate 600. In this case, the control unit 400 may send an on/off control signal to the switching unit 200 through an isolated communication line, and receive the voltage applied to the voltage measurement resistor 110 measured by the voltage measurement unit 300 through the isolated communication line.

Figure 5:
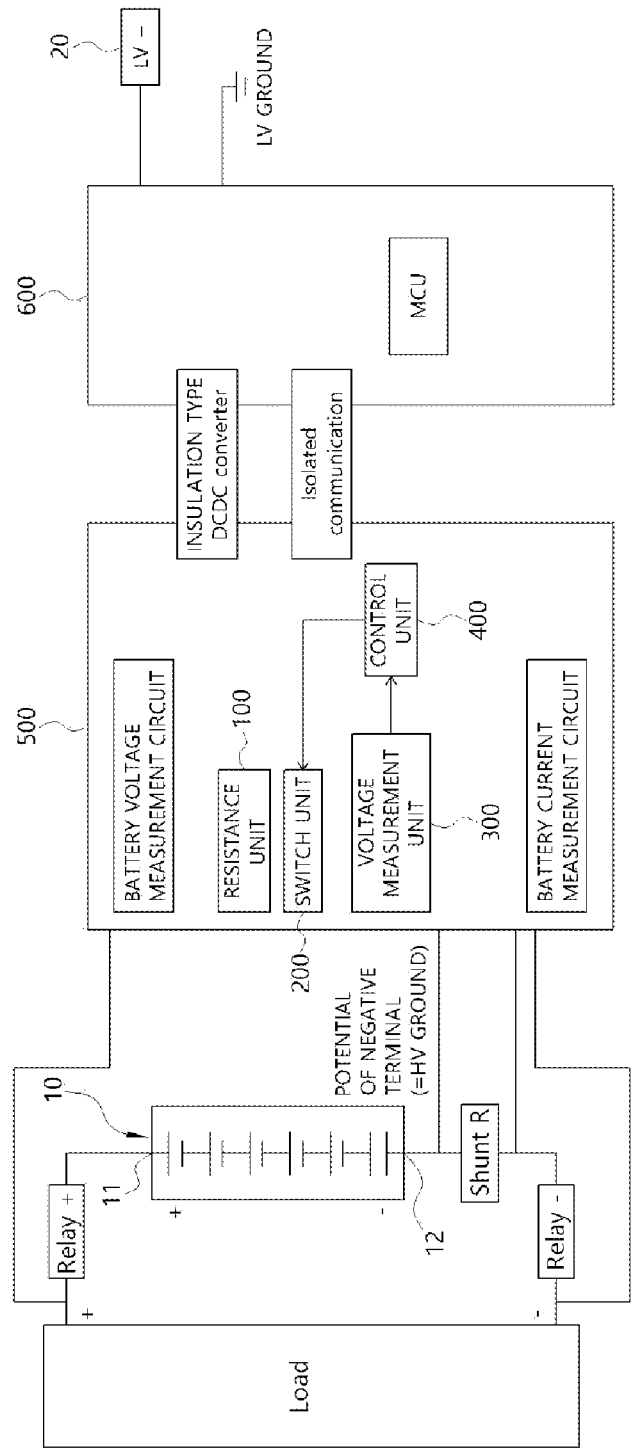
FIG. 5 is a block diagram showing a case in which a position of a control unit is changed as another embodiment of the apparatus for measuring the insulation resistance of the present invention.

Alternatively, in the apparatus for measuring the insulation resistance of the present invention, all of the resistance unit 100, the switching unit 200, the voltage measurement unit 300, and the control unit 400 may be mounted on the first sensing substrate 500 as shown in FIG. 5. In this case, the control unit 400 may be an MCU additionally provided on the first sensing substrate 500. As described above, when the control unit 400 is provided on the first sensing substrate 500 with other configurations, the control unit 400 may control other measurement circuits in addition to the apparatus for measuring the insulation resistance. For example, in addition to the control of the switching unit 200, the control unit 400 may control a battery voltage measurement circuit switch signal or a battery current measurement circuit switch signal. Therefore, the second sensing substrate 600 which is an LV side does not need to insulate the above-described signals and transmit the above-described signals to the first sensing substrate 500 which is the HV side, and components are configured to exchange only a communication signal between the HV side and the LV side, and thus the cost may be reduced.

Referring again to FIG. 4, a voltage measurement circuit of the battery 10, a current measurement circuit of the battery 10, and the voltage measurement unit 300 for measuring the insulation resistance are mounted on the first sensing substrate 500, and the voltage measurement unit 300 measures the voltage using the negative terminal 12 of the battery 10 as a reference potential, and thus the negative terminal 12 of the battery 10 may be used as the ground (HV ground) of the first sensing substrate 500.

In addition, the second sensing substrate 600 on which a device (an MCU, a communication component, etc.) using a negative terminal of the lead acid battery 20 as the ground are mounted may use a negative terminal of the lead acid battery 20 as the ground (LV ground) of the second sensing substrate 600.

That is, because the first sensing substrate 500 and the second sensing substrate 600 are separated into different substrates, different potentials (the HV ground and the LV ground) may be used as grounds, and because the voltage measurement unit 300 is mounted on the first sensing substrate 500, the voltage of the battery 10 having the high voltage is not applied to the second sensing substrate 600, thereby securing a better insulation performance between the sensing substrate 500 which is the HV side and the second sensing substrate 600 which is the LV side.

In addition, as described above, a device requiring a relatively high measurement accuracy is mounted on the first sensing substrate 500, and the first sensing substrate 500 is spatially separated from the second sensing substrate 600, and thus means (for example, a cover for impact protection) protecting the first sensing substrate 500 may be manufactured in a more robust material.

Figure 6:
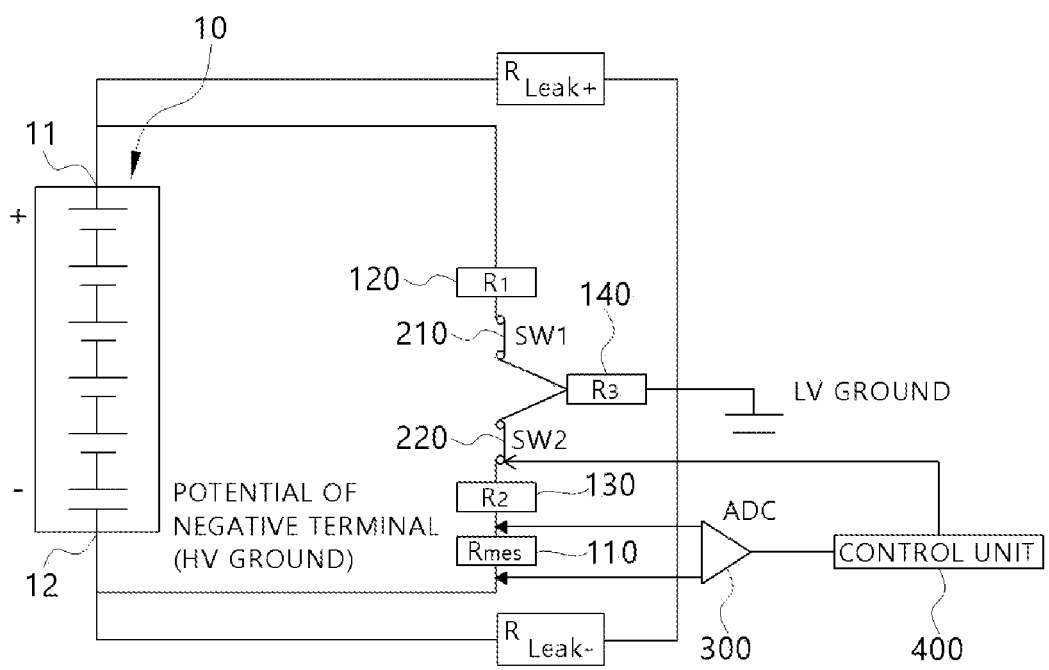
FIG. 6 is a circuit diagram showing a case in which a resistance device is added as another embodiment of the apparatus for measuring the insulation resistance of the present invention.

FIG. 6 is a circuit diagram showing an embodiment in which a resistance device is added to the apparatus for measuring the insulation resistance of the present invention.

Referring to FIG. 6, the resistance unit 100 may further include a third resistor 140 connected to the other end of the first switch 210 and the other end of the second switch 220.

In this regard, the control unit 400 may form a third circuit by operating the first switch 210 in an off state and the second switch 220 in an on state and form a fourth circuit by operating both the first switch 210 and the second switch 220 in the on state.

Here, the third circuit includes a closed circuit to which the battery 10, a positive insulation resistance, the third resistor 140, the second resistor 130, and the voltage measurement resistor 110 are connected and a closed circuit to which the third resistor 140, the second resistor 130, the voltage measurement resistor 110, and a negative electrode insulation resistance are connected.

In addition, the fourth circuit includes a closed circuit to which the battery 10, the first resistor 120, the third resistor 140, the second resistor 130, and the voltage measurement resistor 110 are connected, a closed circuit to which the first resistor 120, the positive insulation resistance, and the third resistor 140 are connected, and a closed circuit to which the third resistor 140, the second resistor 130, the voltage measurement resistor 110, and the negative insulation resistance are connected.

While the third circuit is formed, the voltage measurement unit 300 measures the voltage applied to the voltage measurement resistor 110 and transmits the voltage to the control unit 400. When a voltage distribution principle is applied to the third circuit, Equation 3 below is calculated.

$$V_{Rmes\_SW2} = \text{Pack } V \times \frac{R_{Leak-} \| (R_{mes} + R_2 + R_3)}{R_{Leak+} + R_{Leak-} \| (R_{mes} + R_2 + R_3)} \times \frac{R_{mes}}{(R_{mes} + R_2 + R_3)} \quad \text{[Equation 3]}$$

Thereafter, while the fourth circuit is formed, the voltage measurement unit 300 measures the voltage applied to the voltage measurement resistor 110 and transmits the voltage to the control unit 400. Equation 4 below is calculated through the fourth circuit.

$$V_{Rmes\_SW1\_SW2} = \quad \text{[Equation 4]}$$

$$\text{Pack } V \times \frac{1}{R_c} - \frac{(R_a \| R_{Leak-})}{(R_b \| R_{Leak+}) + (R_a \| R_{Leak-})} \times \frac{1}{R_a} \times R_{mes}$$

Here, Equation 4 satisfies $$R_a = \frac{(R_1 \times R_3) + (R_1 \times (R_2 + R_{mes})) + (R_3 \times (R_2 + R_{mes}))}{R_1}$$

$$R_b = \frac{(R_1 \times R_3) + (R_1 \times (R_2 + R_{mes})) + (R_3 \times (R_2 + R_{mes}))}{(R_2 + R_{mes})}$$

$$R_c = \frac{(R_1 \times R_3) + (R_1 \times (R_2 + R_{mes})) + (R_3 \times (R_2 + R_{mes}))}{R_3}$$

$V_{Rmes\_SW2}$ denotes a voltage applied to the voltage measurement resistor $R_{mes}$ when the first switch 210 operates in the off state and the second switch 220 operates in the on state, $V_{Rmes\_SW1\_SW2}$ denotes a voltage applied to the voltage measurement resistor $R_{mes}$ when both the first switch 210 and the second switch 220 operate in the on state, Pack V denotes the voltage of the battery 10, $R_{mes}$ denotes the value of the voltage measurement resistor 110, $R_1$ denotes the value of the first resistor 120, $R_2$ denotes the value of the second resistor 130, $R_3$ is a value of the third resistor 140, $R_{Leak}+$ denotes the value of the positive insulation resistance, and $R_{Leak}-$ denotes the value of the negative insulation resistance.

That is, the insulation resistance is calculated based on the same principle as the embodiment of FIGS. 2 and 3 except that the third resistor 140 is added.

As described above, according to the apparatus for measuring the insulation resistance of the present invention, a voltage measurement unit may measure a voltage with respect to a potential of a negative terminal of a battery rather than the ground, and thus parameters requiring a high precision may be measured using one device, thereby reducing cost.

In addition, because a first sensing substrate and a second sensing substrate are separated, different potentials may be used as the ground, thereby securing a better insulation performance between the first sensing substrate that is an HV side and the second sensing substrate that is an LV side.

Meanwhile, the embodiment of FIGS. 2 and 3 in which Equations 1 and 2 are calculated and the embodiment of FIG. 6 in which Equations 3 and 4 are calculated are exemplary. Although the present invention is described by the above-described embodiments and drawings, the present invention is not limited to the above embodiments, and various modifications and variations are possible from these descriptions by those of ordinary skill in the art to which the present invention pertains. Therefore, the technical idea of the present invention should be understood only by the claims, and all equal or equivalent modifications thereof belong to the scope of the technical idea of the present invention.

DESCRIPTION OF REFERENCE NUMERALS

10: battery
11: battery positive terminal
12: battery negative terminal
20: lead acid battery
100: resistance unit
110: voltage measurement resistor
120: first resistor 130: second resistor
140: third resistor
200: switching unit
210: first switch
220: second switch
300: voltage measurement unit
400: control unit
500: first sensing substrate
600: second sensing substrate

The invention claimed is:

1. An apparatus for measuring an insulation resistance of a battery, the apparatus comprising:
a resistance unit including a voltage measurement resistor configured to divide and measure a voltage of the battery; a switching unit coupled to the resistance unit and including a first switch and a second switch for forming a different electrical path; and
a control unit measuring a voltage applied to the voltage measurement resistor and monitoring the insulation resistance of the battery;
wherein the voltage measurement resistor is coupled between a negative terminal of the battery and a ground,
wherein the resistance unit further includes a first resistor coupled between a positive terminal of the battery and the ground, a second resistor coupled between the ground and the voltage measurement resistor,
wherein the first switch is coupled between the first resistor and a ground, and the second switch is coupled between the second resistor and the ground,
wherein the first resistor has one end coupled to the positive terminal of the battery and the other end coupled to the first switch,
wherein the second resistor has one end coupled to the voltage measurement resistor and the other end connected to the second switch,
wherein the voltage measurement resistor has one end coupled to the negative terminal of the battery and the other end coupled to the second resistor, and
wherein the control unit measures the voltage applied to the voltage measurement resistor based on a potential of a negative terminal of the battery.

2. The apparatus of claim 1,
wherein the control unit further comprises a voltage measurement unit configured to measure the voltage applied to the voltage measurement resistor,
wherein the voltage measurement resistor is coupled to the negative terminal of the battery, and
wherein the voltage measurement unit is coupled to the voltage measurement resistor and the negative terminal of the battery.

3. The apparatus of claim 1, further comprising:
a first sensing substrate coupled to the battery; and
a second sensing substrate coupled to a lead-acid battery having a lower voltage than the battery, and isolated from the first sensing substrate,
wherein the resistance unit and the switching unit are mounted on the first sensing substrate, and the control unit is mounted on the second sensing substrate.

4. The apparatus of claim 2, further comprising:
a first sensing substrate coupled to the battery; and
a second sensing substrate coupled to a lead-acid battery having a lower voltage than the battery, and isolated from the first sensing substrate,
wherein the resistance unit, the switching unit, the voltage measurement unit and the control unit are mounted on the first sensing substrate.

5. The apparatus of claim 1,
wherein the control unit receives the voltage applied to the voltage measurement resistor while operating the first switch in an off state and the second switch in an on state, and receives the voltage applied to the voltage measurement resistor while operating both the first switch and the second switch in the on state.

6. The apparatus of claim 5,
wherein the control unit calculates a positive insulation resistance and a negative insulation resistance by combining Equation 1 and Equation 2 below:

$$V_{Rmes\_SW2} = \text{Pack } V \times \frac{R_{Leak-} \| (R_{mes} + R_2)}{R_{Leak+} + R_{Leak-} \| (R_{mes} + R_2)} \times \frac{R_{mes}}{(R_{mes} + R_2)} \quad [\text{Equation 1}]$$

$$V_{Rmes\_SW1\_SW2} = \text{Pack } V \times \frac{R_{Leak-} \| (R_{mes} + R_2)}{(R_1 \| R_{Leak+}) + R_{Leak-} \| (R_{mes} + R_2)} \times \frac{R_{mes}}{(R_{mes} + R_2)} \quad [\text{Equation 2}]$$

where $V_{Rmes\_SW2}$ denotes a voltage applied to the voltage measurement resistor when the first switch operates in the off state and the second switch operates in the on state, $V_{Rmes\_SW1\_SW2}$ denotes a voltage applied to the voltage measurement resistor when both the first switch and the second switch operate in the on state, Pack V denotes a voltage of the battery, $R_{mes}$ denotes a value of the voltage measurement resistor, $R_1$ denotes a value of the first resistor, $R_2$ denotes a value of the second resistor, $R_{Leak+}$ denotes a value of the positive insulation resistance, and $R_{Leak-}$ denotes a value of the negative insulation resistance.

7. The apparatus of claim 1,
wherein the resistance unit further includes a third resistor coupled between the switching unit and the ground.

8. The apparatus of claim 7,
wherein the control unit receives the voltage applied to the voltage measurement resistor while operating the first switch in an off state and the second switch in an on state, and receives the voltage applied to the voltage measurement resistor while operating both the first switch and the second switch in the on state.

9. The apparatus of claim 8,
wherein the control unit calculates a positive insulation resistance and a negative insulation resistance by combining Equation 3 and Equation 4 below:

$$V_{Rmes\_SW2} = \text{Pack } V \times \frac{R_{Leak-} \| (R_{mes} + R_2 + R_3)}{R_{Leak+} + R_{Leak-} \| (R_{mes} + R_2 + R_3)} \times \frac{R_{mes}}{(R_{mes} + R_2 + R_3)} \quad [\text{Equation 3}]$$

$$V_{Rmes\_SW1\_SW2} = \text{Pack } V \times \frac{1}{R_c} - \frac{(R_a \| (R_{Leak-}))}{(R_b \| R_{Leak+}) + (R_a \| R_{Leak-})} \times \frac{1}{R_a} \times R_{mes} \quad [\text{Equation 4}]$$

where Equation 4 satisfies $$R_a = \frac{(R_1 \times R_3) + (R_1 \times (R_2 + R_{mes})) + (R_3 \times (R_2 + R_{mes}))}{R_1}$$

$$R_b = \frac{(R_1 \times R_3) + (R_1 \times (R_2 + R_{mes})) + (R_3 \times (R_2 + R_{mes}))}{(R_2 + R_{mes})}$$

-continued $$R_c = \frac{(R_1 \times R_3) + (R_1 \times (R_2 + R_{mes})) + (R_3 \times (R_2 + R_{mes}))}{R_3}$$

where $V_{Rmes\_SW2}$ denotes a voltage applied to the voltage measurement resistor when the first switch operates in the off state and the second switch operates in the on state, $V_{Rmes\_SW1\_SW2}$ denotes a voltage applied to the voltage measurement resistor when both the first switch and the second switch operate in the on state, Pack V denotes a voltage of the battery, $R_{mes}$ denotes a value of the voltage measurement resistor, $R_1$ denotes a value of the first resistor, $R_2$ denotes a value of the second resistor, $R_3$ is a value of a third resistor, $R_{Leak}+$ denotes a value of the positive insulation resistance, and $R_{Leak}-$ denotes a value of the negative insulation resistance.

\* \* \* \* \*

UNITED STATES PATENT AND TRADEMARK OFFICE
CERTIFICATE OF CORRECTION

PATENT NO. : 11,656,265 B2  
APPLICATION NO. : 17/226470  
DATED : May 23, 2023  
INVENTOR(S) : Woo Jung Kim Page 1 of 1

It is certified that error appears in the above-identified patent and that said Letters Patent is hereby corrected as shown below:

In the Claims

Column 12, Lines 56-58, Claim 9, delete "$Pack\ V \times \frac{1}{R_c}$" and insert -- $Pack\ V \times [\frac{1}{R_c}$ --

Column 12, Lines 56-58, Claim 9, delete "$\frac{1}{R_a} \times R_{mes}$" and insert -- $\frac{1}{R_a}] \times R_{mes}$ --

Signed and Sealed this  
Second Day of January, 2024

Katherine Kelly Vidal  
*Director of the United States Patent and Trademark Office*